(12) United States Patent
Dai et al.

(10) Patent No.: US 9,780,002 B1
(45) Date of Patent: Oct. 3, 2017

(54) THRESHOLD VOLTAGE AND WELL IMPLANTATION METHOD FOR SEMICONDUCTOR DEVICES

(71) Applicant: GLOBALFOUNDRIES Inc., Grand Cayman (KY)

(72) Inventors: Xintuo Dai, Rexford, NY (US); Brian Greene, Fishkill, NY (US); Mahender Kumar, Fishkill, NY (US); Daniel J. Dechene, Watervliet, NY (US); Daniel Jaeger, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/173,766

(22) Filed: Jun. 6, 2016

(51) Int. Cl.
*H01L 21/8238* (2006.01)
*H01L 21/308* (2006.01)
(Continued)

(52) U.S. Cl.
CPC .. *H01L 21/823892* (2013.01); *H01L 21/0271* (2013.01); *H01L 21/0276* (2013.01); *H01L 21/02118* (2013.01); *H01L 21/02238* (2013.01); *H01L 21/02255* (2013.01); *H01L 21/26506* (2013.01); *H01L 21/26513* (2013.01); *H01L 21/3065* (2013.01); *H01L 21/3083* (2013.01); *H01L 21/31155* (2013.01); *H01L 21/76213* (2013.01); *H01L 21/76224* (2013.01); *H01L 21/823821* (2013.01); *H01L 27/0207* (2013.01); *H01L 27/0924* (2013.01); *H01L 29/66795* (2013.01); *H01L 29/66803* (2013.01)

(58) Field of Classification Search
CPC ......... H01L 21/02238; H01L 21/02255; H01L 21/26506; H01L 21/3083; H01L 21/31155; H01L 21/76213; H01L 21/76224; H01L 29/66795; H01L 21/02118; H01L 21/0271; H01L 21/0276; H01L 21/26513; H01L 21/3065; H01L 21/76816; H01L 21/76831; H01L 21/76897; H01L 21/823821; H01L 21/823857; H01L 21/845; H01L 23/5226; H01L 23/528; H01L 21/26586; H01L 21/823814; H01L 27/0207; H01L 27/0924
See application file for complete search history.

(56) References Cited

U.S. PATENT DOCUMENTS 9,312,191 B2 * 4/2016 Li ..................... H01L 21/845
9,443,770 B2 * 9/2016 Dong ................ H01L 21/82382
(Continued)

*Primary Examiner* — Bac Au
(74) *Attorney, Agent, or Firm* — Ditthavong & Steiner, P.C.

(57) ABSTRACT

Methodologies for patterning and implantation are provided Embodiments include forming fins; forming an SiN over the fins; forming an a-Si layer over the SiN; forming and patterning a first patterning layer over the a-Si layer; etching through the a-Si layer using the first patterning layer as a mask; removing the first patterning layer; implanting ions in exposed groups of fins; forming and patterning a second patterning layer to expose a first group of fins and a portion of the a-Si layer on opposite sides of the first group of fins; implanting ions in a first region of the first group of fins; forming a third patterning layer over the first region of the first group of fins and exposing a second region of the first group of fins; and implanting ions in the second region of the first group of fins.

20 Claims, 10 Drawing Sheets

(51) Int. Cl.
H01L 21/02 (2006.01)
H01L 21/027 (2006.01)
H01L 21/265 (2006.01)
H01L 21/3115 (2006.01)
H01L 21/3065 (2006.01)
H01L 21/762 (2006.01)
H01L 29/66 (2006.01)
H01L 27/092 (2006.01)
H01L 27/02 (2006.01)

(56) References Cited

U.S. PATENT DOCUMENTS 9,673,083 B2 * 6/2017 Jacob ................ H01L 21/76213
2014/0113420 A1 * 4/2014 Sargunas .......... H01L 21/82382
438/231

* cited by examiner

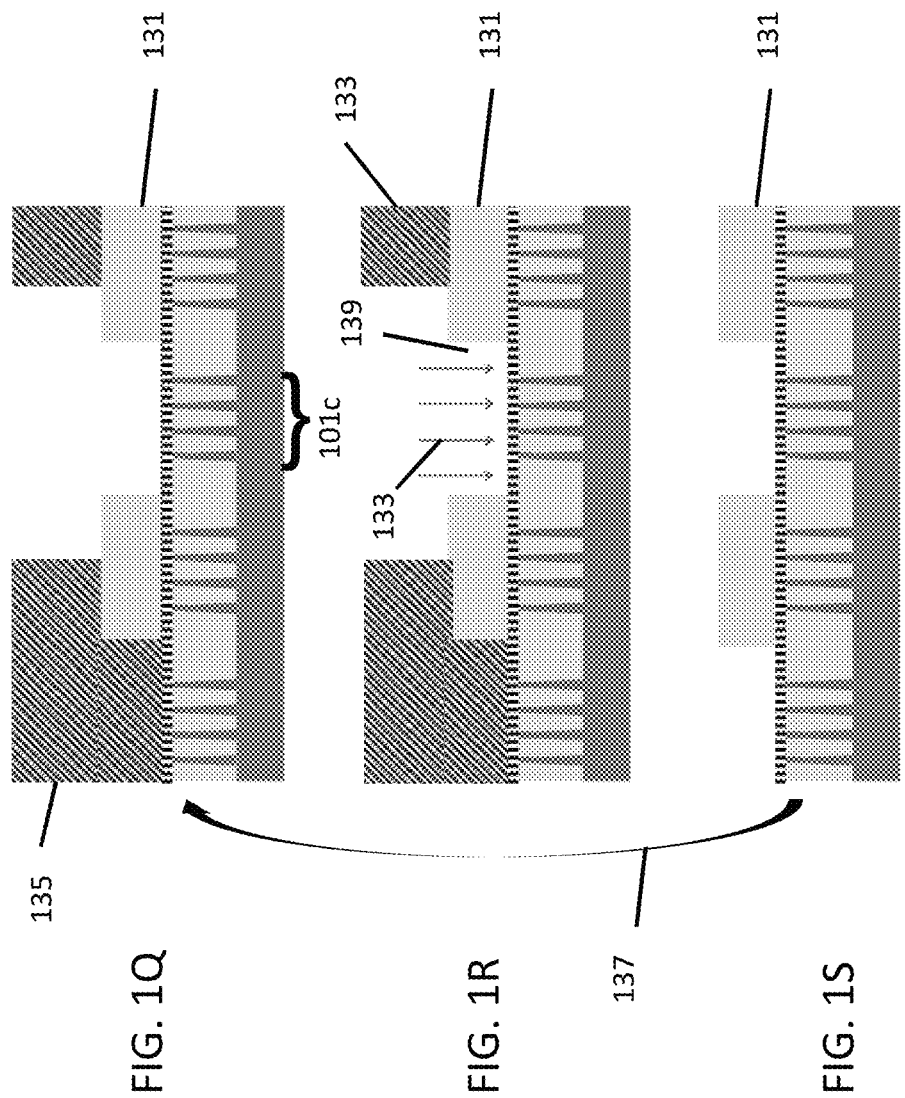

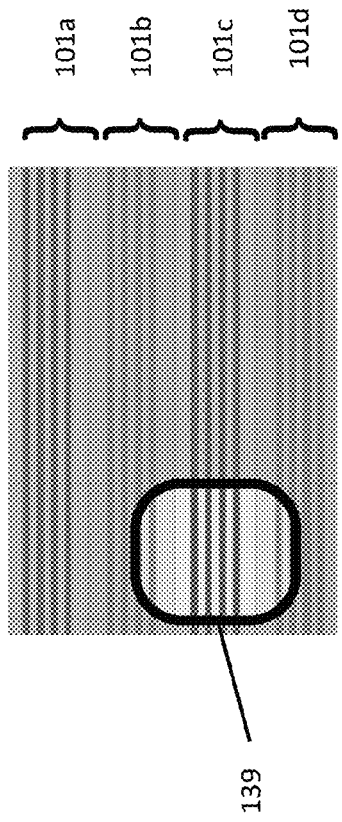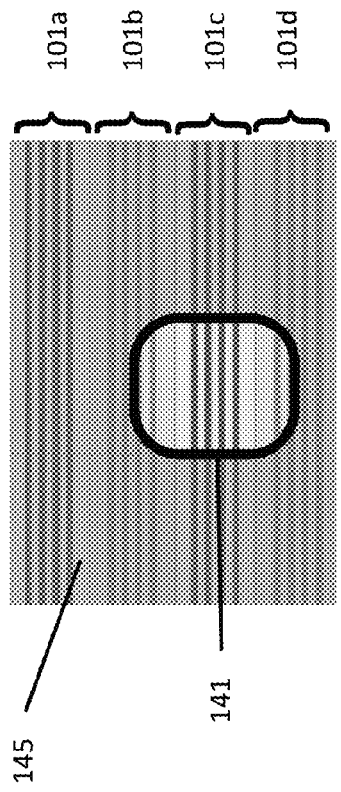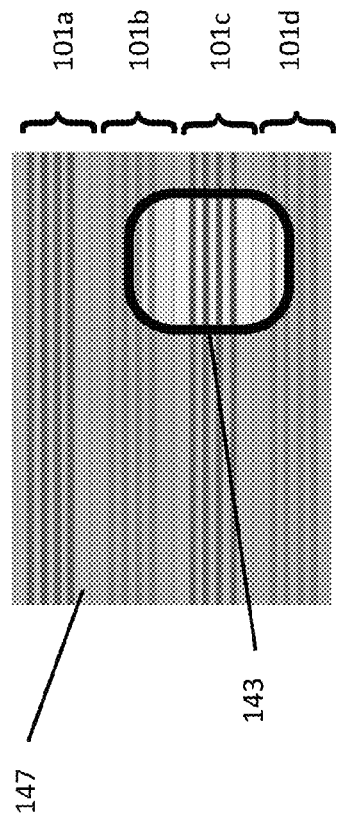

(Background)

THRESHOLD VOLTAGE AND WELL IMPLANTATION METHOD FOR SEMICONDUCTOR DEVICES

TECHNICAL FIELD

The present disclosure relates to lithography and ion implantation of semiconductor devices. In particular, the present disclosure relates to patterning and ion implanting techniques for semiconductor devices with fins in the 10 nanometer (nm) technology node and beyond.

BACKGROUND

As semiconductor processing proceeds in the 10 nm technology node, a significant number of technical challenges force the use of more costly immersion layers. Some technical challenges include the minimum area requirement for critical gate pitch (3CPP), a N-P junction breakdown process margin which is much tighter in the 10 nm technology node, and corner rounding requirement (CRR) which is more critical in the 10 nm technology node. As a result of these technical challenges an immersion process for multiple layers becomes necessary. With existing processing in the 10 nm technology node, a significant reduction in process margin exists due to the impact of edge placement, compounding of CRR and required process bias.

With other existing processes, even if a well based threshold voltage (Vt) adjustment is enabled, the Vt adjustment levels still are victim to minimum area limitations prohibiting 3CPP cell swap. In other existing processes, N-P junction spacing reduction in 10 nm cells has reduced the relative breakdown margin by 33%. Due to overlay, fin placement and critical dimension (CD) tolerances, migration to immersion processing becomes necessary to recover the 33% reduction in margin. A current static random-access memory (SRAM) cell is further challenged with an additional reduction in the N-P space of almost 10%. The influence of topography, boolean comps and etch bias can further negatively impact patterning margin with tight N-P junction spacing.

A need therefore exists for methodology enabling patterning and implantation that can improve N-P junction spacing and CRR without relying on expensive immersion processes.

SUMMARY

An aspect of the present disclosure is a unique patterning and implantation scheme that can improve N-P junction spacing and CRR without using expensive immersion processes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming groups of fins in regions over a substrate; forming an silicon nitride (SiN) over the groups of fins; forming an amorphous silicon (a-Si) layer over the SiN; forming and patterning a first patterning layer over the a-Si layer; etching through the a-Si layer down to the SiN using the first patterning layer as a mask; removing the first patterning layer; implanting ions in exposed groups of fins following the etching of the a-Si layer; forming and patterning a second patterning layer to expose a first group of fins and a portion of the a-Si layer on opposite sides of the first group of fins; implanting ions in a first region of the first group of fins; forming a third patterning layer over the first region of the first group of fins and exposing a second region of the first group of fins; and implanting ions in the second region of the first group of fins.

Aspects include forming an oxide layer between individual fins and between the groups of fins and forming the SiN over the oxide layer. Other aspects include forming a fourth patterning layer over at least the second region of the first group of fins. Additional aspects include removing the fourth patterning layer to expose a third region of the first group of fins. Yet further aspects include implanting ions in the third region of the first group of fins. Other aspects include depositing a second oxide layer over the SiN and a-Si layer. Aspects include planarizing the second oxide layer down to an upper surface of the a-Si layer. Additional aspects include removing the a-Si layer after planarizing the second oxide layer. Further aspects include implanting ions in exposed second groups of fins following the removal of the a-Si layer. Yet another aspect includes forming and patterning a fifth patterning layer to expose the second group of fins and a portion of the second oxide layer on opposite sides of the second group of fins. Other aspects include implanting ions in a first region of the second group of fins. Additional aspects include forming a sixth patterning layer over the first region of the second group of fins and exposing a second region of the second group of fins. Yet other aspects include implanting ions in the second region of the second group of fins. Additional aspects include forming a seventh patterning layer over the second region of the second group of fins and exposing a third region of the second group of fins. Further aspects include removing the seventh patterning layer; removing the second oxide layer; and removing the SiN.

In yet another aspect of the present application a method is provided which includes forming groups of fins in regions over a substrate; forming SiN over the groups of fins; forming an a-Si over the SiN; forming and patterning a first patterning layer over the a-Si layer; etching through the a-Si layer down to the SiN using the first patterning layer as a mask; removing the first patterning layer; implanting ions in exposed groups of fins following the etching of the a-Si layer; forming and patterning a second patterning layer to expose a first group of fins in an NFET region and a portion of the a-Si layer formed over a second group of fins in a PFET region; implanting ions in a first region of the first group of fins; forming a third patterning layer over at least the first region of the first group of fins and exposing a second region of the first group of fins; and implanting ions in the second region of the first group of fins.

Aspects include forming a fourth patterning layer over at least the second region of the first group of fins and exposing a third region of the first group of fins; and implanting ions in the third region of the first group of fins. Certain aspects include depositing an oxide layer over the SiN and a-Si layer; planarizing the oxide layer down to an upper surface of the a-Si layer; removing the a-Si layer; and implanting ions in groups of fins exposed following the removal of the a-Si layer. Further aspects include forming and patterning a fifth patterning layer to expose the second group of fins in the PFET region and a portion of the oxide layer in a second NFET region; implanting ions in a first region of the second group of fins; forming a sixth patterning layer over at least the first region of the second group of fins and exposing a second region of the second group of fins; implanting ions in the second region of the second group of fins; forming a seventh patterning layer over at least the second region of the second group of fins and exposing a third region of the second group of fins; removing the seventh patterning layer; removing the second oxide layer; and removing the SiN.

In yet another aspect of the present application, a method is provided which includes forming groups of fins in regions over a substrate, wherein an oxide layer is formed between individual fins and between the groups of fins; forming SiN over the oxide layer; forming an a-Si layer over the SiN; forming and patterning a first patterning layer over the a-Si layer; etching through the a-Si layer down to the SiN using the first patterning layer as a mask; removing the first patterning layer; implanting ions in exposed groups of fins following the etching of the a-Si layer; forming and patterning a second patterning layer to expose a first group of fins in an NFET region and a portion of the a-Si layer formed over a second group of fins in a PFET region; implanting ions in a first region of the first group of fins; forming a third patterning layer over at least the first region of the first group of fins and exposing a second region of the first group of fins; implanting ions in the second region of the group of fins; forming a fourth patterning layer over at least the second region of the first group of fins; removing the fourth patterning layer to expose a third region of the first group of fins; and implanting ions in the third region of the third group of fins.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current technical problem of a need for costly immersion layers attendant upon the minimum area requirement for critical gate pitch, a tight N-P junction breakdown process margin, and critical CRR which are prevalent in semiconductor processing in the 10 nm technology node and beyond. Methodology in accordance with embodiments of the present disclosure includes forming groups of fins in regions over a substrate; forming an silicon nitride (SiN) over the groups of fins; forming an amorphous silicon (a-Si) layer over the SiN; forming and patterning a first patterning layer over the a-Si layer; etching through the a-Si layer down to the SiN using the first patterning layer as a mask; removing the first patterning layer; implanting ions in exposed groups of fins following the etching of the a-Si layer; forming and patterning a second patterning layer to expose a first group of fins and a portion of the a-Si layer on opposite sides of the first group of fins; implanting ions in a first region of the first group of fins; forming a third patterning layer over the first region of the first group of fins and exposing a second region of the first group of fins; and implanting ions in the second region of the first group of fins.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
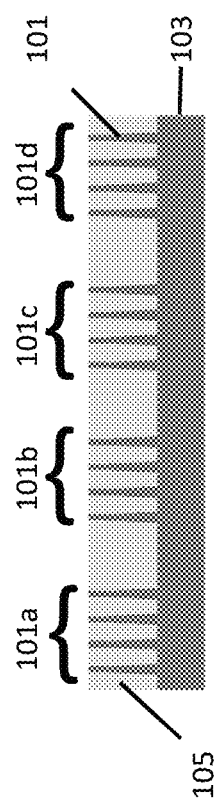
FIGS. 1A through 1X schematically illustrate a patterning and implantation process flow, in accordance with an exemplary embodiment.
Figure 1B:
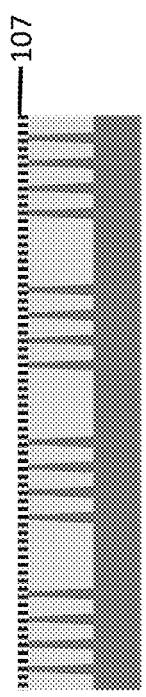
Figure 1C:
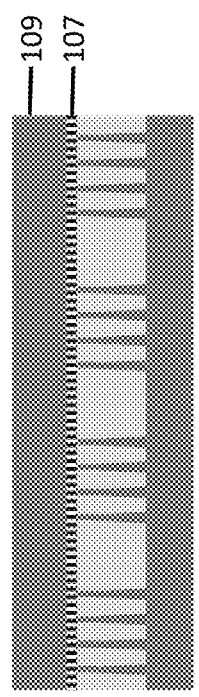

Adverting to FIG. 1A, a plurality of fins 101 are formed over a substrate 103. The steps for forming shallow trench isolation (STI) regions, chemical mechanical polishing (CMP), deglaze and SiN removal have already been performed. Both the fins 101 and substrate can be formed of silicon (Si). An oxide layer 105 is formed between individual fins 101. As illustrated in FIG. 1A, the fins 101 are separated in groups of fins 101a, 101b, 101c, and 101d. In FIG. 1B, a SiN 107 is formed over the groups of fins 101a, 101b, 101c, and 101d and the oxide layer 105. The SiN 107 is formed to a thickness of 5 to 15 nm. Adverting to FIG. 1C, a-Si layer 109 is deposited over the SiN 107 and planarized to a thickness of 100 to 200 nm.

Figure 1D:
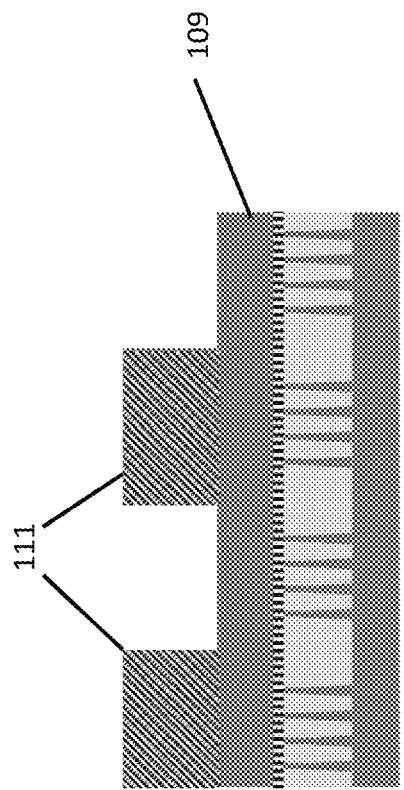
Figure 1E:
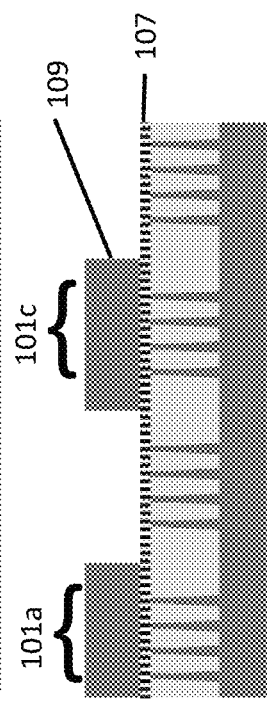
Figure 1F:
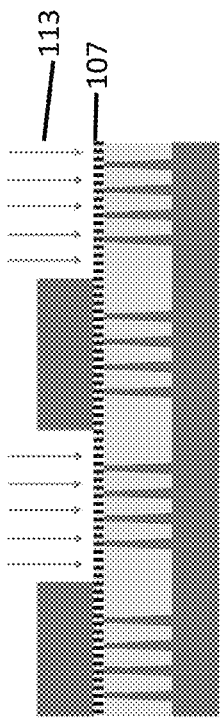

Adverting to FIG. 1D, a first patterning layer 111 is deposited and patterned over the a-Si layer 109. The first patterning layer 111 is a silicon based layer including SiOC. In FIG. 1E, an etching step is performed such that the a-Si layer 109 is etched down to the SiN 107 using the first patterning layer 111 as a mask. The first patterning layer 111 is removed. As shown in FIG. 1E, the portions of the a-Si layer 109 are formed over groups of fins 101a and 101c. Adverting to FIG. 1F, ions 113 are implanted in the exposed groups of fins 101b and 101d following the etching of the a-Si layer 109. The ion implantation includes implanting phosphorous (P) or boron (B) ions in source/drain regions (not shown for illustrative convenience) of the fins 101 at a concentration of E12 to E13.

Figure 1G:
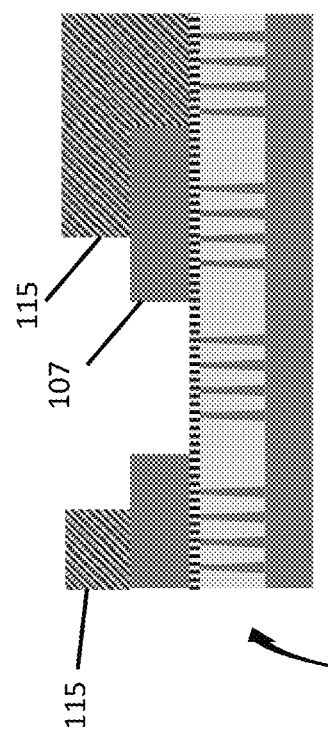
Figure 1H:
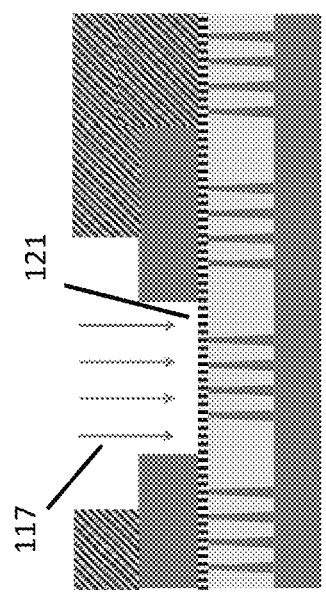
Figure 1I:
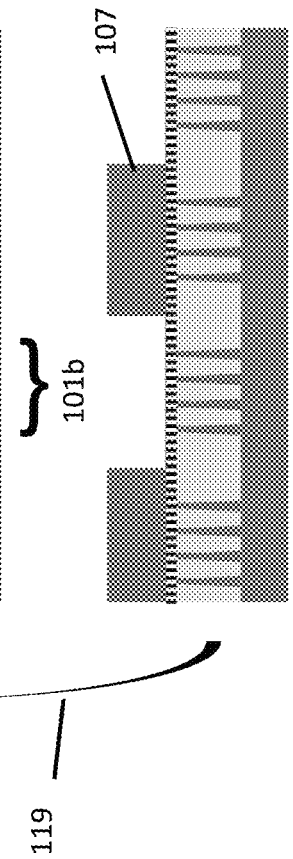
Figure 1J:
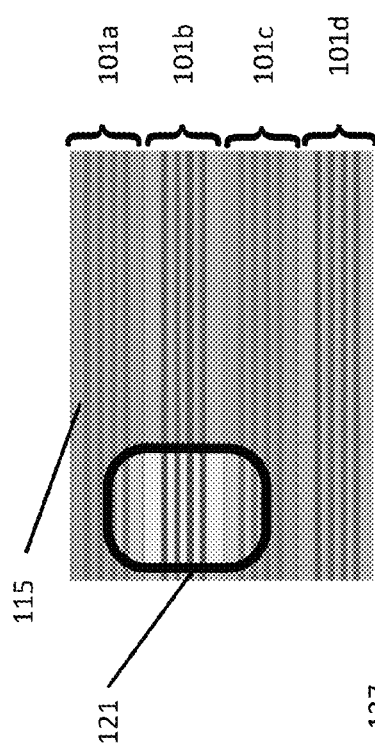
Figure 1K:
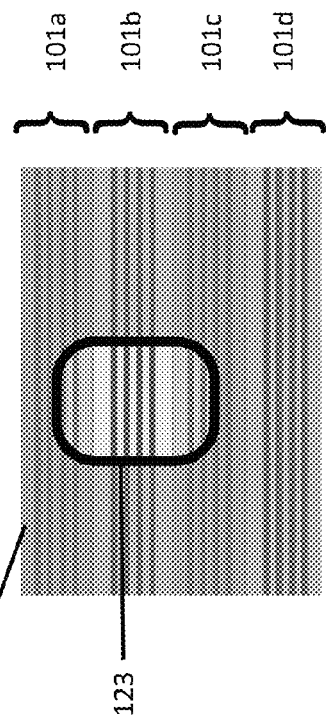
Figure 1L:
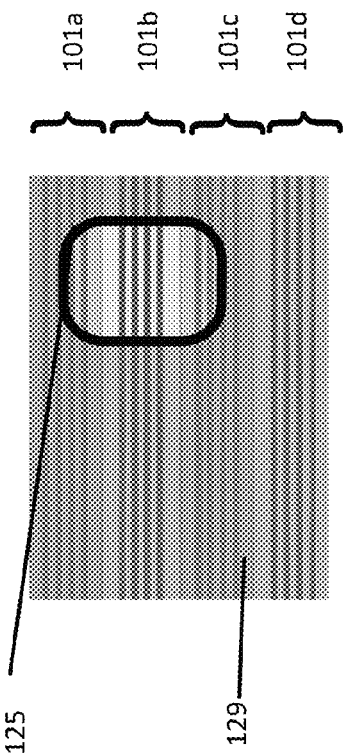

Adverting to FIG. 1G, a second patterning layer 115 is formed and patterned to expose a group of fins 101b and a portion of the a-Si layer 109 on opposite sides of the group of fins 101b. As shown in FIG. 1H, ions 117 are implanted in a first region 121 of the group of fins 101b. As illustrated in FIG. 1I, the second patterning layer 115 is removed after ions 117 are implanted. The processes in FIGS. 1G, 1H and 1I are then repeated for second and third regions of the group of fins 101b, as indicated by directional arrow 119. The first, second, and third regions 121, 123 and 125 of the group of fins 101b are illustrated in FIGS. 1J, 1K, and 1L, respectively, which are top views of the groups of fins 101a, 101b, 101c and 101d. In FIG. 1K, a third patterning layer 127 is formed over the first region 121 of the group of fins 101b, and the second region 123 of the first group of fins 101b is exposed after removal of the third a-Si layer from the second region 123. After the second region 123 is exposed, the third patterning layer 127 covers all of the groups of fins 101a, 101b, 101c and 101d except for the second region 123. The second region 123 is then subjected to ion implantation and the third patterning layer 127 is removed. The second region 123 exposes a group of fins 101b and a portion of the a-Si layer 109 on opposite sides of the group of fins 101b. In FIG. 1L, a fourth patterning layer 129 is formed, and a portion of it is removed to expose the third region 125. The third region 125 exposes a group of fins 101b and a portion of the a-Si layer 109 on opposite sides of the group of fins 101b. The third region 125 is then subjected to ion implantation, and the fourth patterning layer 129 is subsequently removed.

Figure 1M:
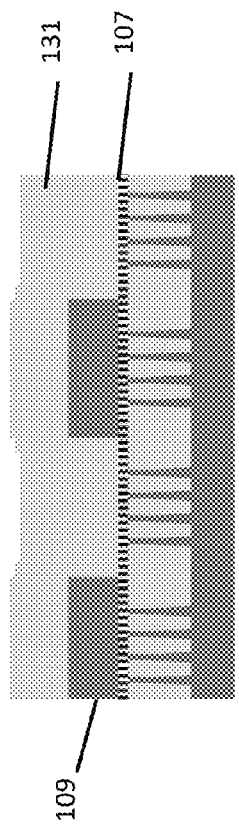
Figure 1N:
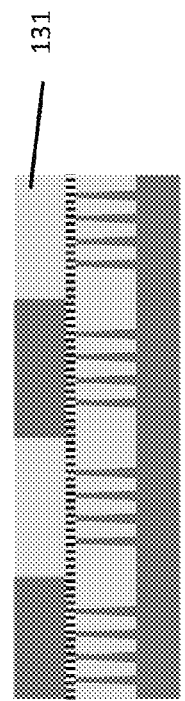
Figure 1O:
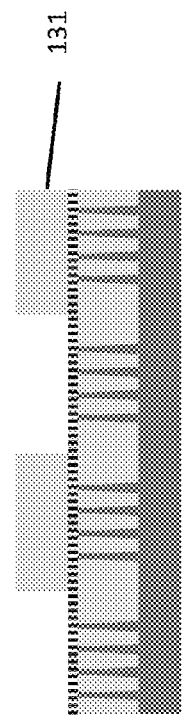
Figure 1P:
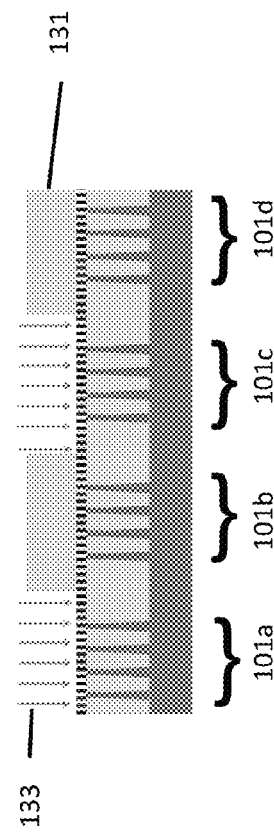

Adverting to FIG. 1M, a second oxide layer 131 is blanket deposited over the SiN 107 layer and a-Si layer 109. In FIG. 1N, the second oxide layer 131 is polished and planarized with CMP. The second oxide layer 131 is polished down to an upper surface of the a-Si layer 109. In FIG. 1O, the a-Si layer 109 is removed after polishing the second oxide layer 131. In FIG. 1P, ions 133 are implanted in the groups of fins 101a and 101c. The ion implantation includes implanting ions 133, such as B, arsenic (As), germanium (Ge), P, etc. in source/drain regions (not shown for illustrative convenience) of the fins 101 at a concentration of E12 to E15.

Adverting to FIG. 1Q, a fifth patterning layer 135 is formed and patterned to expose the group of fins 101c and a portion of the second oxide layer 131 on opposite sides of the group of fins 101c. In FIG. 1R, ions are implanted in a first region 139 of the group of fins 101c. In FIG. 1S, the fifth patterning layer 135 is removed after ions 133 are implanted.

The processes in FIGS. 1Q, 1R, and 1S are then repeated for second and third regions of the group of fins 101c, as indicated by directional arrow 137. The first, second, and third regions 139, 141 and 143 of the group of fins 101c are illustrated in FIGS. 1T, 1U, and 1V, respectively, which are top views of the groups of fins 101a, 101b, 101c and 101d. In FIG. 1U, a sixth patterning layer 145 is formed over the first region 139 of the group of fins 101c, and the second region 141 of the group of fins 101c is exposed after removal of the sixth a-Si layer from the second region 141. After the second region 141 is exposed, the sixth patterning layer 145 covers all of the groups of fins 101a, 101b, 101c and 101d except for the second region 141. The second region 141 is then subjected to ion implantation, and the sixth patterning layer 145 is removed after ion implantation. The second region 141 exposes a group of fins 101c and a portion of the second oxide layer 131 on opposite sides of the group of fins 101c. In FIG. 1V, a seventh patterning layer 147 is formed, and a portion of it is removed to expose the third region 143. The third region 143 exposes a group of fins 101c and a portion of the second oxide layer 131 on opposite sides of the group of fins 101c. The third region 143 is then subjected to ion implantation, and the seventh patterning layer 147 is subsequently removed after ion implantation.

Figures 1W, 1X:
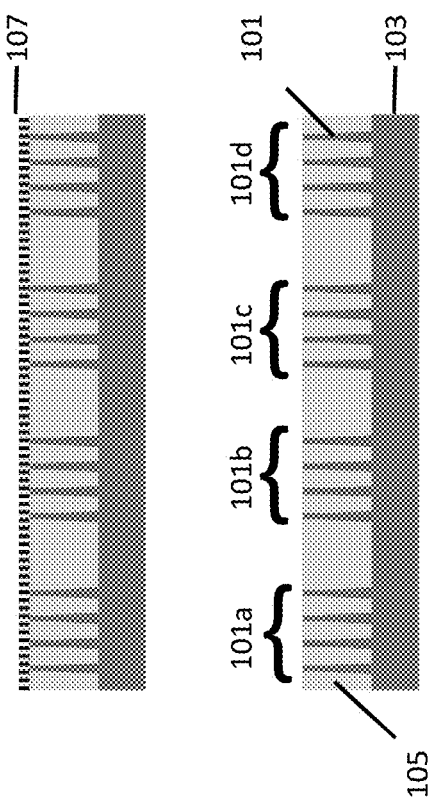

Adverting to FIG. 1W, the second oxide layer 131 is removed such that the SiN layer 107 remains. The SiN 107 is then removed in FIG. 1X.

Figure 2:
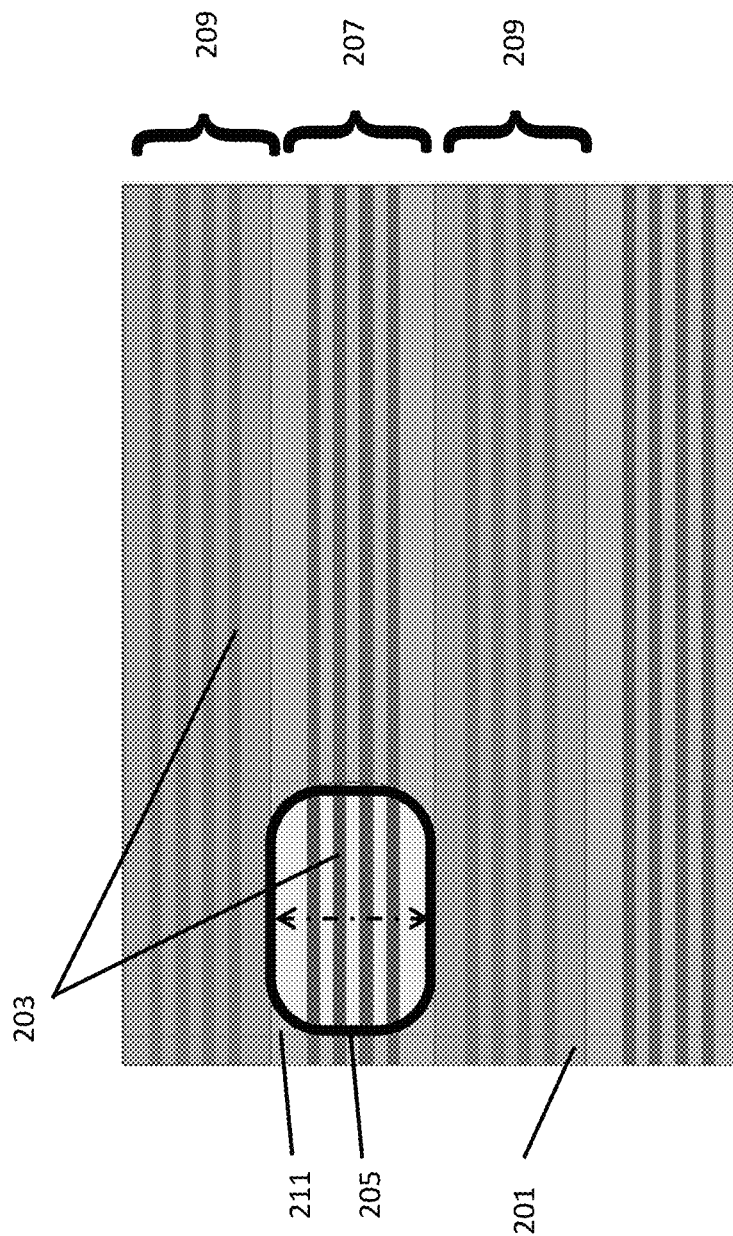
FIG. 2 illustrates a device manufactured with conventional processing of an NFET region with CRR of an implantation area.

Adverting to FIG. 2, a device manufactured with a conventional process is shown. A mask 201 is formed over underlying fins 203. The mask 201 is patterned to reveal the underlying fins 203 in region 205. The region 205 is patterned in a NFET region 207 and cannot extend to PFET regions 209 on either side of the NFET region 207 with conventional processing. Thus, the p direction CD (represented with the bi-directional arrow) is limited by the NFET p width. Moreover CRR exists in each of corners 211 with the conventional processing.

Figure 3:
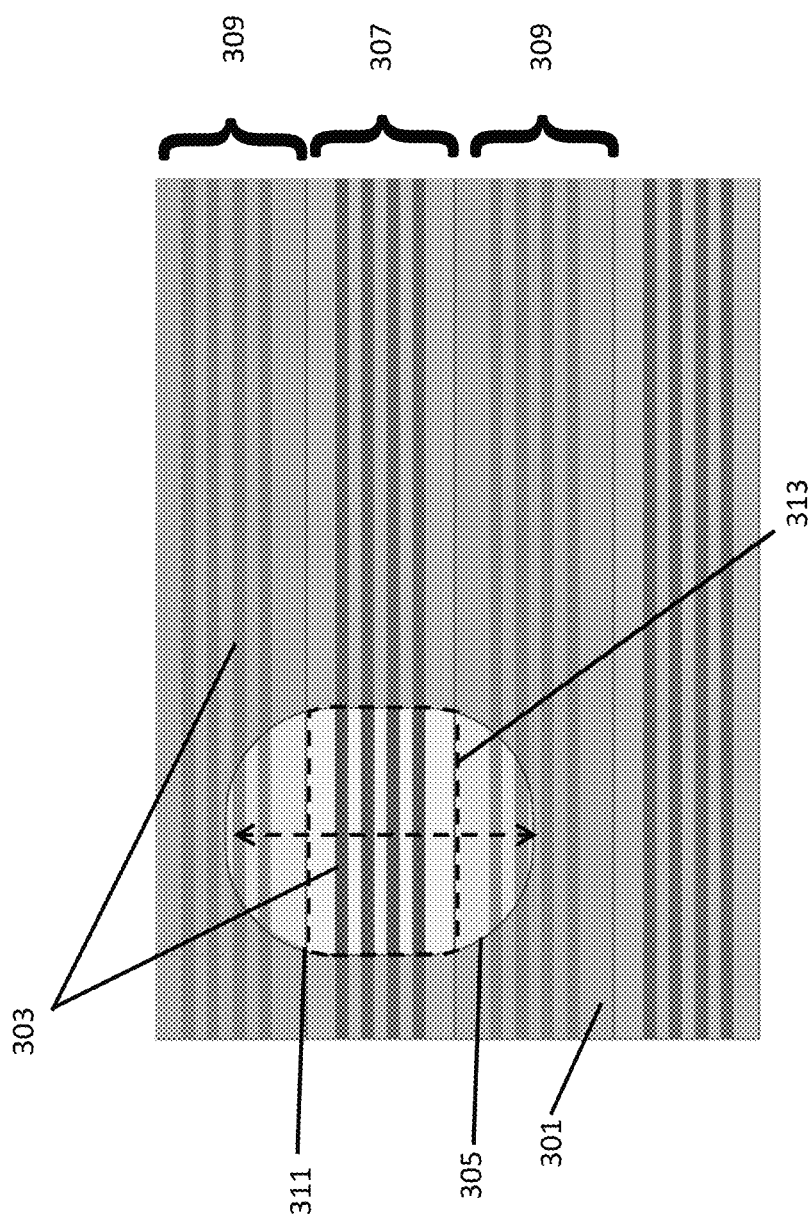
FIG. 3 illustrates a device manufactured with an exemplary embodiment where CRR is eliminated in an implantation area.

Adverting to FIG. 3, a device manufactured in accordance with the exemplary embodiment is shown. A mask 301 is formed over underlying fins 303. The mask 301 is patterned to reveal the underlying fins 303 in oval-shaped region 305. The oval-shaped region 305 is patterned in a NFET region 307 and can extend to PFET regions 309 on either side of the NFET region 307, in accordance with the present disclosure. Thus, the p direction CD (represented with the bi-directional arrow) is not limited by the NFET p width, but rather the p direction CD size is doubled or even merged. Moreover, CRR is eliminated in each of the four corners 311 of the dashed rectangle 313, in accordance with the present disclosure. The photolithography equipment used can include excimer laser systems such as an ArFi excimer laser system, argon fluoride (ArF), and krypton fluoride (KrF). These excimer laser systems are less costly than immersion layer processing equipment.

The embodiments of the present disclosure can achieve several technical effects including minimum area recovery and CRR recovery. The embodiments of the present disclosure can achieve cost reduction by reducing the number of masks used to process a semiconductor device and by replacing the more expensive immersion process for multiple layers with less expensive photolithographic processes. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming groups of fins in regions over a substrate;
   forming an silicon nitride (SiN) over the groups of fins;
   forming an amorphous silicon (a-Si) layer over the SiN;
   forming and patterning a first patterning layer over the a-Si layer;
   etching through the a-Si layer down to the SiN using the first patterning layer as a mask;
   removing the first patterning layer;

implanting ions in exposed groups of fins following the etching of the a-Si layer;
forming and patterning a second patterning layer to expose a first group of fins and a portion of the a-Si layer on opposite sides of the first group of fins;
implanting ions in a first region of the first group of fins;
forming a third patterning layer over the first region of the first group of fins and exposing a second region of the first group of fins; and
implanting ions in the second region of the first group of fins.

2. The method according to claim 1, further comprising:
forming an oxide layer between individual fins and between the groups of fins and forming the SiN over the oxide layer.

3. The method according to claim 2, further comprising:
forming a fourth patterning layer over at least the second region of the first group of fins.

4. The method according to claim 3, further comprising:
removing the fourth patterning layer to expose a third region of the first group of fins.

5. The method according to claim 4, further comprising:
implanting ions in the third region of the first group of fins.

6. The method according to claim 5, further comprising:
depositing a second oxide layer over the SiN and a-Si layer.

7. The method according to claim 6, further comprising:
planarizing the second oxide layer down to an upper surface of the a-Si layer.

8. The method according to claim 7, further comprising:
removing the a-Si layer after planarizing the second oxide layer.

9. The method according to claim 8, further comprising:
implanting ions in exposed second groups of fins following the removal of the a-Si layer.

10. The method according to claim 8, further comprising:
forming and patterning a fifth patterning layer to expose the second group of fins and a portion of the second oxide layer on opposite sides of the second group of fins.

11. The method according to claim 10, further comprising:
implanting ions in a first region of the second group of fins.

12. The method according to claim 11, further comprising:
forming a sixth patterning layer over the first region of the second group of fins and exposing a second region of the second group of fins.

13. The method according to claim 12, further comprising:
implanting ions in the second region of the second group of fins.

14. The method according to claim 13, further comprising:
forming a seventh patterning layer over the second region of the second group of fins and exposing a third region of the second group of fins.

15. The method according to claim 14, further comprising:
removing the seventh patterning layer;
removing the second oxide layer; and
removing the SiN.

16. A method comprising:
forming groups of fins in regions over a substrate;
forming a silicon nitride (SiN) over the groups of fins;
forming an amorphous silicon (a-Si) over the SiN;
forming and patterning a first patterning layer over the a-Si layer;
etching through the a-Si layer down to the SiN using the first patterning layer as a mask;
removing the first patterning layer;
implanting ions in exposed groups of fins following the etching of the a-Si layer;
forming and patterning a second patterning layer to expose a first group of fins in an NFET region and a portion of the a-Si layer formed over a second group of fins in a PFET region;
implanting ions in a first region of the first group of fins;
forming a third patterning layer over at least the first region of the first group of fins and exposing a second region of the first group of fins; and
implanting ions in the second region of the first group of fins.

17. The method according to claim 16, further comprising:
forming a fourth patterning layer over at least the second region of the first group of fins and exposing a third region of the first group of fins; and
implanting ions in the third region of the first group of fins.

18. The method according to claim 17, further comprising:
depositing an oxide layer over the SiN and a-Si layer;
planarizing the oxide layer down to an upper surface of the a-Si layer;
removing the a-Si layer; and
implanting ions in groups of fins exposed following the removal of the a-Si layer.

19. The method according to claim 18, further comprising:
forming and patterning a fifth patterning layer to expose the second group of fins in the PFET region and a portion of the oxide layer in a second NFET region;
implanting ions in a first region of the second group of fins;
forming a sixth patterning layer over at least the first region of the second group of fins and exposing a second region of the second group of fins;
implanting ions in the second region of the second group of fins;
forming a seventh patterning layer over at least the second region of the second group of fins and exposing a third region of the second group of fins;
removing the seventh a-Si layer;
removing the oxide layer; and
removing the SiN.

20. A method comprising:
forming groups of fins in regions over a substrate, wherein an oxide layer is formed between individual fins and between the groups of fins;
forming a silicon nitride (SiN) over the oxide layer;
forming an amorphous silicon (a-Si) layer over the SiN;
forming and patterning a first patterning layer over the a-Si layer;
etching through the a-Si layer down to the SiN using the first patterning layer as a mask;
removing the first patterning layer;
implanting ions in exposed groups of fins following the etching of the a-Si layer;

forming and patterning a second patterning layer to expose a first group of fins in an NFET region and a portion of the a-Si layer formed over a second group of fins in a PFET region;

implanting ions in a first region of the first group of fins;

forming a third patterning layer over at least the first region of the first group of fins and exposing a second region of the first group of fins;

implanting ions in the second region of the group of fins;

forming a fourth patterning layer over at least the second region of the first group of fins;

removing the fourth patterning layer to expose a third region of the first group of fins; and implanting ions in the third region of the third group of fins.

* * * * *